(12) United States Patent
Watanabe et al.

(10) Patent No.: US 7,973,439 B2
(45) Date of Patent: Jul. 5, 2011

(54) INVERTER-INTEGRATED ELECTRIC COMPRESSOR

(75) Inventors: Takayuki Watanabe, Aichi (JP); Takashi Nakagami, Aichi (JP); Koji Nakano, Aichi (JP); Makoto Hattori, Aichi (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 276 days.

(21) Appl. No.: 12/442,788

(22) PCT Filed: Nov. 4, 2008

(86) PCT No.: PCT/JP2008/070004
§ 371 (c)(1),
(2), (4) Date: Mar. 25, 2009

(87) PCT Pub. No.: WO2009/060810
PCT Pub. Date: May 14, 2009

(65) Prior Publication Data
US 2010/0181877 A1 Jul. 22, 2010

(30) Foreign Application Priority Data

Nov. 6, 2007 (JP) ................................. 2007-288813

(51) Int. Cl.
*H02K 11/00* (2006.01)
(52) U.S. Cl. .......................................... 310/71; 310/89
(58) Field of Classification Search .................... 310/71, 310/68 R, 68 D, 89
See application file for complete search history.

(56) References Cited

U.S. PATENT DOCUMENTS

| | | | |
|---|---|---|---|
| 6,291,914 B1 * | 9/2001 | Mukaiyama | 310/68 B |
| 6,472,785 B2 * | 10/2002 | Petit et al. | 310/71 |
| 7,224,093 B2 * | 5/2007 | Abadia et al. | 310/68 B |
| 7,608,950 B2 * | 10/2009 | Brauer | 310/68 R |
| 7,781,925 B2 * | 8/2010 | Lacaze | 310/71 |

(Continued)

FOREIGN PATENT DOCUMENTS

| | | |
|---|---|---|
| JP | 2002-171768 A | 6/2002 |
| JP | 2004-190525 A | 7/2004 |
| JP | 3786356 B2 | 6/2006 |
| JP | 2006-233820 A | 9/2006 |
| JP | 2007-282309 A | 10/2007 |

OTHER PUBLICATIONS

International Search Report of PCT/JP2008/070004, date of mailing date Jan. 13, 2009.

*Primary Examiner* — Thanh Lam
(74) *Attorney, Agent, or Firm* — Westerman, Hattori, Daniels & Adrian, LLP (57) ABSTRACT

Provided is an inverter-integrated electric compressor capable of reducing the size of an inverter accommodating section by modularizing a power circuit board and a control board and further reducing the size of an inverter device, as well as an accommodating section thereof, by improving the positional structure with respect to other electrical components. An inverter-integrated electric compressor including an inverter accommodating section provided on a periphery of a housing accommodating an inverter device includes an inverter module constructed by integrally modularizing a power circuit board and a control board, wherein attachment legs provided on both edges of at least one side surface of the inverter module protrude outward from a module main body, and the inverter module accommodates the inverter accommodating section with the attachment legs positioned in spaces at both ends of a glass-insulated terminal.

5 Claims, 5 Drawing Sheets

U.S. PATENT DOCUMENTS

| | | |
|---|---|---|
| 2003/0200761 A1 | 10/2003 | Funahashi et al. |
| 2006/0138883 A1* | 6/2006 | Yagai et al. ............... 310/71 |
| 2007/0170792 A1* | 7/2007 | Bott et al. ............... 310/71 |
| 2008/0062622 A1* | 3/2008 | Fukazu et al. ............... 361/678 |
| 2008/0231127 A1* | 9/2008 | Lacaze ............... 310/71 |
| 2008/0265586 A1* | 10/2008 | Like et al. ............... 290/38 R |

* cited by examiner

INVERTER-INTEGRATED ELECTRIC COMPRESSOR

TECHNICAL FIELD

The present invention relates to an inverter-integrated electric compressor for a vehicle air-conditioner in which an inverter accommodating section is provided on the periphery of a housing accommodating an electric motor and a compressing mechanism, and an inverter device is accommodated in the interior thereof.

BACKGROUND ART

Recently, various inverter-integrated electric compressors constructed by integrating inverter devices have been proposed as inverter-integrated electric compressors for vehicle air-conditioners. Such an inverter-integrated electric compressor for a vehicle air-conditioner is provided with an inverter accommodating section (inverter box) that is disposed on the periphery of a housing accommodating an electric motor and a compressing mechanism, and an inverter device that is accommodated in the interior thereof that converts DC power supplied from a high-voltage power supply into three-phase AC power and supplies it to the electric motor via a glass-insulated terminal. In this way, the rotational speed of the electric compressor can vary in response to the air conditioning load. An example of such an inverter-integrated electric compressor is that described in, for example, Patent Document 1.

As described in Patent Document 1, the inverter device includes a power circuit board on which are mounted semiconductor power switching devices to which high voltage is usually input; a control board (printed board) on which control and communication circuits that operate at low voltage are mounted; and high-voltage components, such as a head capacitor (smoothing capacitor), an inductor coil, and a common mode coil, that are connected to a high-voltage power supply line, wherein these components are compactly accommodated in an inverter accommodating section (inverter box or frame section).

Patent Document 1: Publication of Japanese Patent No. 3786356

DISCLOSURE OF INVENTION

With the increasing of components density in the engine compartments of vehicles, there is a need for reducing the size of compressors for vehicle air conditioners even more in order to ensure their mounting convenience. Therefore, for an inverter-integrated electric compressor having an integrated inverter device, there is a strong need for reducing the size of the inverter accommodating section containing the inverter device. To satisfy this need to reduce the size of the inverter accommodating section, work is in progress to modularize the inverter device integrated with the power circuit board and control board (printed board).

However, even when making a compact structure by integrally modularizing the power circuit board and control board (printed board) of inverter device with, the size of the inverter device and the inverter accommodating section cannot be sufficiently reduced. In other words, in addition to the power circuit board and the control board, inside the inverter accommodating section, there are provided P-N terminals connected to a high-voltage cable; high-voltage components, such as a head capacitor, an inductor coil, and a common mode coil, connected to a high-voltage power supply line thereof; a high-voltage bus-bar constituting electrical wiring among the high-voltage components, the P-N terminals, and the power circuit board; and electrical components, such as a glass-insulated terminal, for supplying three-phase AC power converted at the inverter device to an electric motor. The positional structure with respect to these electrical components is the key to increasing the components density in the inverter accommodating section. There is still some margin for improvement in the size reduction of the inverter accommodating section.

The present invention has been conceived in light of the circumstances described above, and it is an object of the present invention to provide an inverter-integrated electric compressor capable of modularizing the inverter device integrated with the power circuit board and control board and of further reducing the size of the inverter device and the accommodating section thereof by improving the positional structure with respect to other electrical components.

To solve the problems described above, the inverter-integrated electric compressor according to the present invention provides the following solutions.

Specifically, an inverter-integrated electric compressor according to an aspect of the present invention is provided with an inverter accommodating section on a periphery of a housing accommodating an electric motor and a compressing mechanism, and an inverter device that converts DC power supplied from a high-voltage power supply into three-phase AC power and supplies the three-phase AC power to the electric motor in the housing via a glass-insulated terminal is accommodated inside thereof, wherein the inverter device includes an inverter module constructed by integrally modularizing a power circuit board on which a semiconductor switching device and so on are mounted and a control board on which control and communication circuits and so on operating at low voltage are mounted, wherein attachment legs protruding outward from a module main body are provided at both ends of at least one side surface of the inverter module, and wherein the inverter module is accommodated in the inverter accommodating section with the attachment legs positioned in spaces at both ends of the glass-insulated terminal.

According to the above-described aspect, since the inverter module constructed by integrally modularizing the power circuit board and the control board of the inverter device is provided, and the attachment legs provided on one side surface protrude from the module main body, the size of the module main body can be reduced by an amount corresponding to the outward protrusion of the attachment legs. Moreover, since the inverter module is accommodated inside the inverter accommodating section with the outwardly protruding attachment legs positioned in spaces at both ends of the glass-insulated terminal, the inverter module can be installed by efficiently utilizing the dead space formed at both ends of the glass-insulated terminal. By such a synergistic effect, the inverter device and the inverter accommodating section can be made smaller and even more compact. Accordingly, the size and weight of the inverter-integrated electric compressor can be reduced even more, and the mounting convenience can be improved.

With the above-described aspect, the inverter module may be substantially cuboid, and the attachment legs provided at both ends of two opposing side surfaces thereof may all protrude outward from the module main body.

According to the above-described aspect, since all attachment legs provided at both ends of two opposing side surfaces of the substantially cuboid inverter module protrude outward from the module main body, the shape of the boards constituting the inverter module can be simple rectangles. In this way, the positions of the devices, electronic components, circuits, and so on provided on the boards can be simplified, and, as a result, the size of the inverter module can be reduced. Accordingly, the size of the inverter device and the inverter accommodating section can be reduced even more.

With the above-described configuration, other electrical components constituting the inverter device may be positioned in a space between the attachment legs provided on the other side surfaces of the two opposing side surfaces of the inverter module.

According to the above-described configuration, since other electrical components, such as a capacitor or an inductor, constituting the inverter device are positioned in a space between the attachment legs provided on the other side surface of the two opposing side surfaces of the inverter module, space inside the inverter accommodating section can be utilized efficiently, and the components density can be increased even more. In this way, the size of the inverter device and the inverter accommodating section can be reduced even more.

With the above-described configuration, the attachment legs provided on each side surfaces of the two opposing side surfaces of the inverter module may be positioned with an offset in a direction orthogonal to a motor axis direction of the electric motor with respect to the module main body.

According to the above-described configuration, since the attachment legs provided on each side surface of the two opposing side surfaces of the inverter module are positioned with an offset in a direction orthogonal to a motor axis direction of the electric motor with respect to the module main body, when the inverter accommodating section and the inverter device are disposed with an offset in a direction orthogonal to the motor axis direction with respect to the housing and when a structure for protecting the high-voltage system in a crash is provided, the attachment legs of the inverter module can be secured with screws on the housing side at substantially equal distances on either side of the motor axis. Therefore, screw holes for screwing may be vertically formed at thick-walled parts of the housing. In this way, the screw holes can prevent a reduction in the pressure resistance strength of the housing, and the screw holes can be formed at positions away from the refrigerant circulation path (positions where the axes of the screws do not penetrate the motor housing). In this way, refrigerant gas leakage due to exposure of porosity inside the housing to the screw holes can be reduced, and the gas-tightness of the housing can be ensured.

According to the present invention, the module main body can be made more compact by making the attachment legs of the inverter module protrude outward. Moreover, by installing the inverter modules with the attachment legs positioned in spaces at both ends of the glass-insulated terminal, the inverter module can be installed by efficiently utilizing dead space formed at both ends of the glass-insulated terminal. Therefore, by such a synergistic effect, the inverter device and the inverter accommodating section can be made even more compact, the inverter-integrated electric compressor can be made even more compact and lightweight, and the mounting convenience thereof can be improved.

EXPLANATION OF REFERENCE SIGNS

1: inverter-integrated electric compressor
2: housing
9: electric motor
11: inverter accommodating section
20: inverter device
21: head capacitor
22: inductor coil
24: inverter module
26: glass-insulated terminal
27: module main body
30A, 30B, 30C, 30D: attachment legs
H: offset dimension
L: motor axis

BEST MODE FOR CARRYING OUT THE INVENTION

Embodiments of the present invention will be described below with reference to the drawings.

First Embodiment

A first embodiment of the present invention will be described with reference to FIGS. 1 to 3D.

Figure 1:
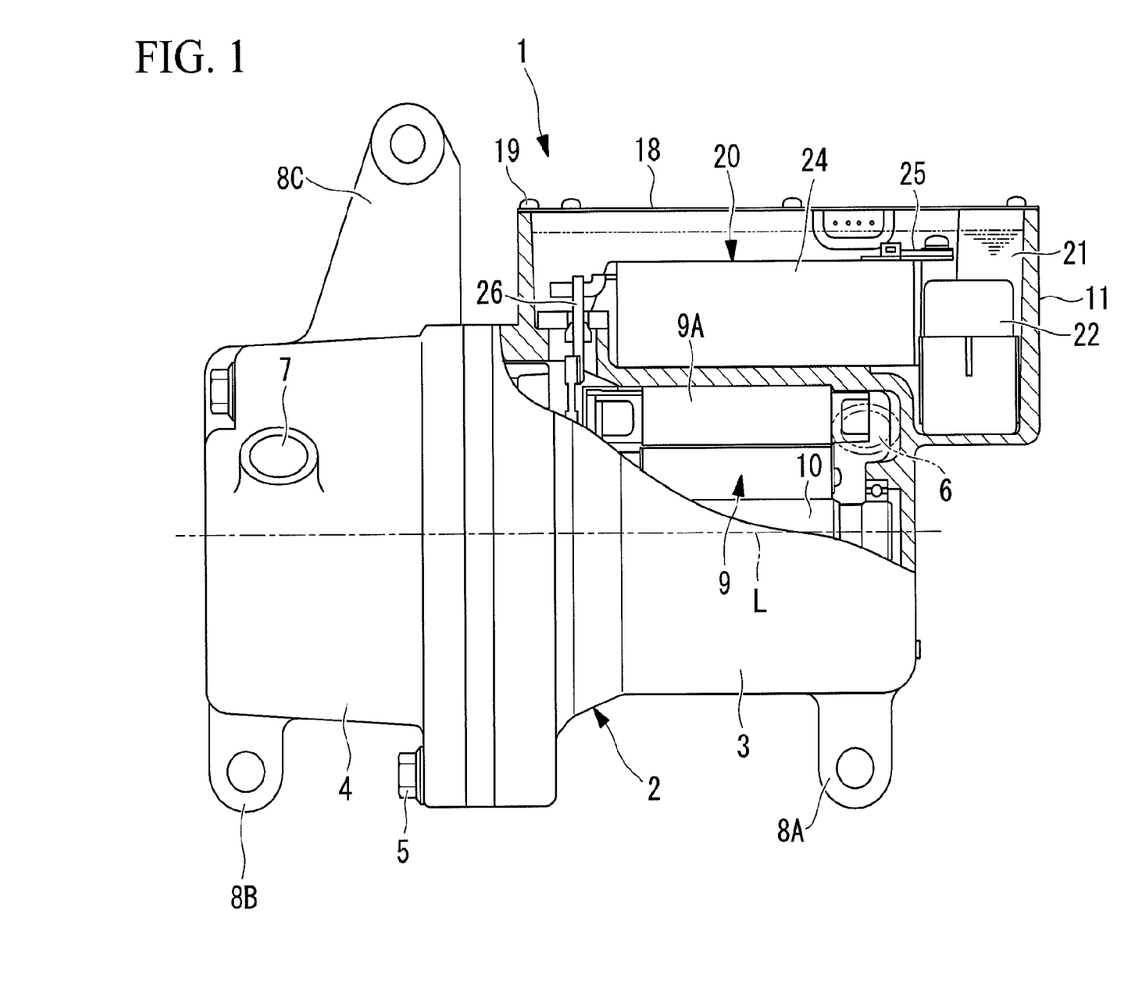
FIG. 1 is a partial longitudinal sectional view showing, in a cutaway form, an inverter accommodating section of an inverter-integrated electric compressor according to a first embodiment of the present invention.
Figure 2:
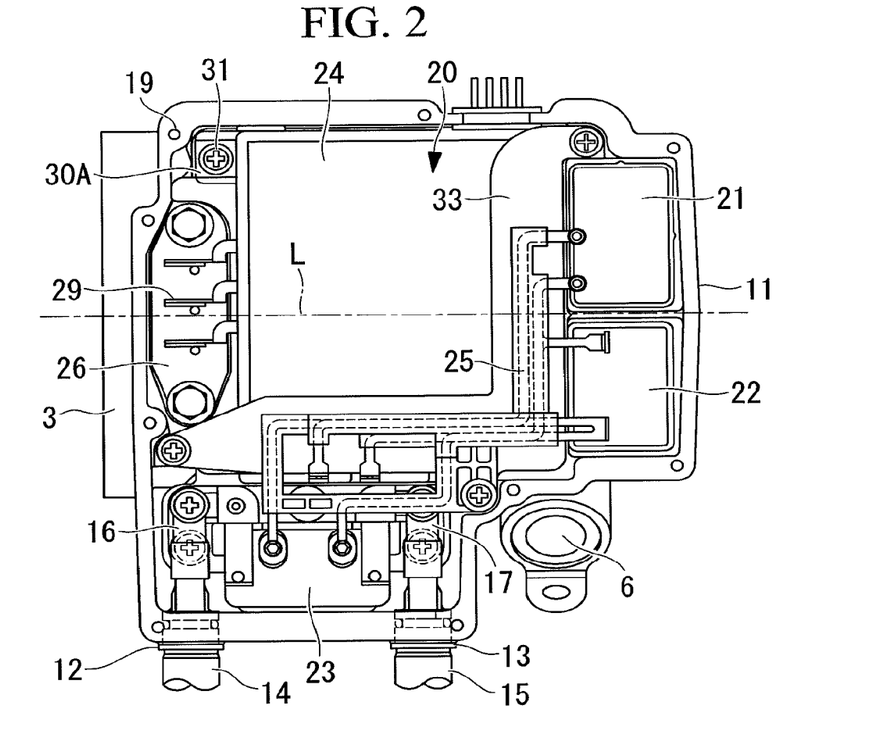
FIG. 2 is a plan view of a state in which a cover member of the inverter accommodating section of the inverter-integrated electric compressor illustrated in FIG. 1 is removed.
Figure 3A:
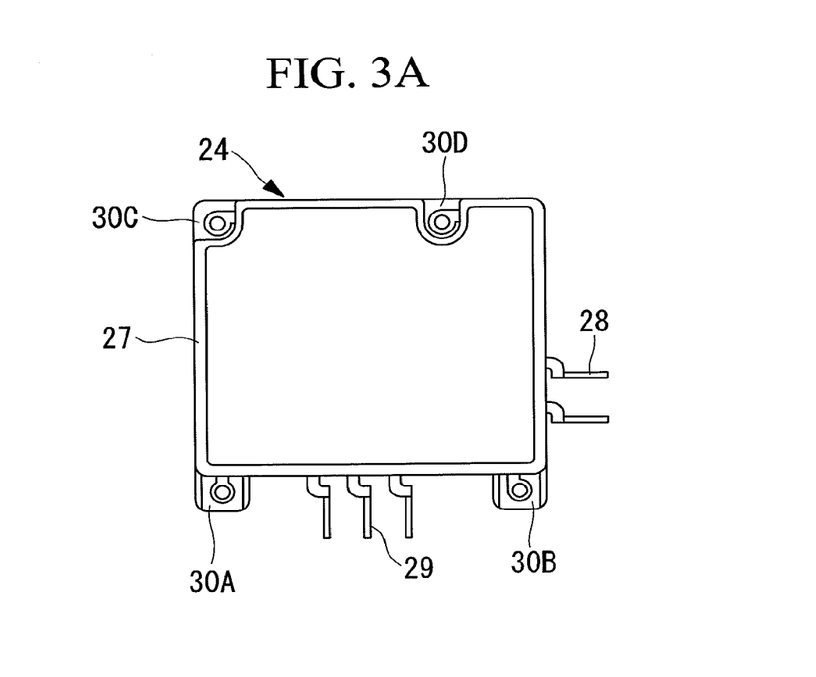
FIG. 3A is a plan view of an inverter module of the inverter-integrated electric compressor illustrated in FIG. 1.
Figure 3B:
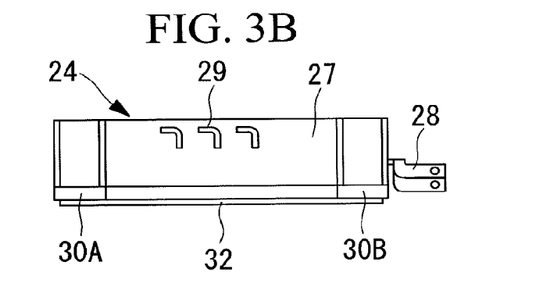
FIG. 3B is a lower view of the inverter module of the inverter-integrated electric compressor illustrated in FIG. 1.
Figure 3C:
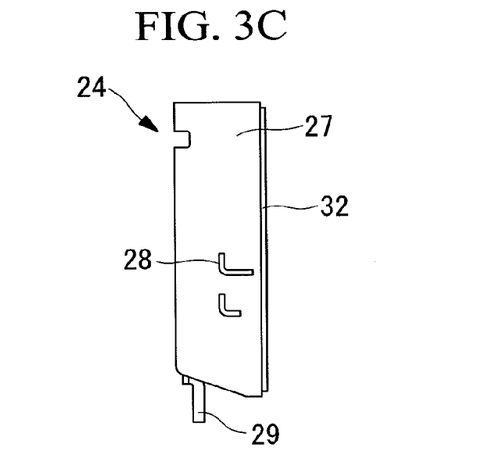
FIG. 3C is a right-side view of the inverter module of the inverter-integrated electric compressor illustrated in FIG. 1.
Figure 3D:
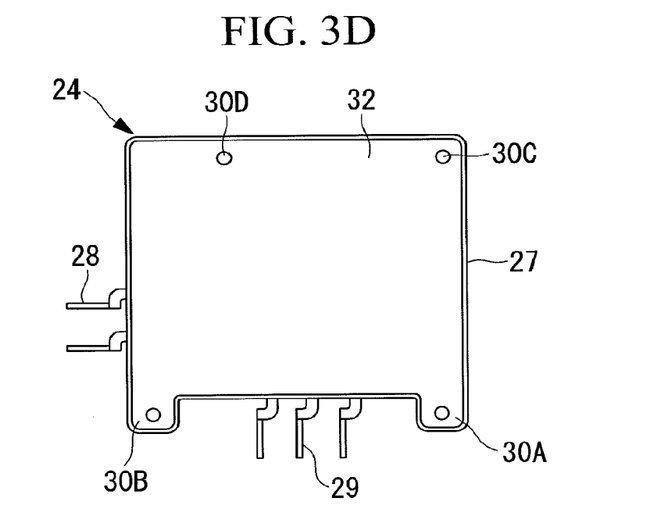
FIG. 3D is a bottom view of the inverter module of the inverter-integrated electric compressor illustrated in FIG. 1.

FIG. 1 is a partial sectional view showing, in a cutaway form, an inverter accommodating section of an inverter-integrated electric compressor according to a first embodiment of the present invention. FIG. 2 is a plan view of a state in which a cover member thereof is removed. An inverter-integrated electric compressor 1 includes a housing 2 that forms the outer shell thereof. The housing 2 is constructed by securely tightening integrally a motor housing 3 for accommodating an electric motor 9 and a compressor housing 4 for accommodating a compressing mechanism, which is not shown in the drawing, with bolts 5. The motor housing 3 and the compressor housing 4 are pressure-resistant containers and are formed of aluminum alloy by aluminum die-casting.

The electric motor 9 and the compressing mechanism, which is not shown in the drawing, accommodated inside the housing 2 are linked via a motor shaft 10 (see FIG. 1), and the compressing mechanism is configured to be driven by rotation of the electric motor 9. A refrigerant suction port 6 (see FIG. 2) is provided at one end (on the right side in FIG. 1) of the motor housing 3, so that low-temperature, low-pressure refrigerant gas taken in from this refrigerant suction port 6 into the motor housing 3 flows around the electric motor 9 in the motor axis L direction and is then taken into the compressing mechanism, where it is compressed. High-temperature, high-pressure refrigerant gas compressed by the compressing mechanism is released into the compressor housing 4 and is then expelled to the outside via a discharge port 7 provided at the other end (on the left side in FIG. 1) of the compressor housing 4.

The housing 2 has three mounting legs 8A, 8B, and 8C: two at a lower part at one end (on the right side in FIG. 1) of the motor housing 3 and a lower part one end (on the left side in FIG. 1) of the compressor housing 4, and one at an upper part of the compressor housing 4. The inverter-integrated electric compressor 1 is mounted by securing these mounting legs 8A, 8B, and 8C to a side wall etc. of a driving motor, which is provided inside the engine compartment of the vehicle, with a bracket and bolts. The inverter-integrated electric compressor 1 is usually cantilevered at three points on the upper and lower sides with a securing bracket such that the motor shaft direction L is in the front-to-back direction or the left-to-right direction of the vehicle.

A box-shaped inverter accommodating section 11 is integrated with the periphery of the motor housing 3 at the upper section thereof. FIG. 1 is a partial longitudinal sectional view showing, in a cutaway form, the inverter accommodating section 11. As shown in FIGS. 1 and 2, the inverter accommodating section 11 is shaped like a box that is open at the top and surrounded by a periphery wall having a predetermined height. The upper opening is sealed with a cover member 18 secured with screws 19, with a sealing material (not shown) therebetween. Two power-supply-cable lead-out holes 12 and 13 are provided on a side surface of the inverter accommodating section 11 so that a power supply, such as a generator or a battery, and an inverter device 20 mounted inside the inverter accommodating section 11 can be connected via two P-N power-supply cables 14 and 15.

The inverter device 20 mounted inside the inverter accommodating section 11 is constructed of P-N terminals 16 and 17 to be connected to the power-supply cables 14 and 15; high-voltage components, such as a head capacitor 21, an inductor coil 22, and a common mode coil 23, which are provided on a high-voltage power supply line; an inverter module 24 that forms the core of the inverter device 20; a high-voltage bus-bar 25 including integrated a plurality of bus bars, which constitute the electrical wiring among the high-voltage components, the P-N terminals 16 and 17, and the inverter module 24, inside the inverter device 20, and being composed of insert-molded insulating resin material; and a glass-insulated terminal 26 that supplies three-phase AC power, which is converted at the inverter device 20, to the electric motor 9.

The inverter module 24 is a modularized component formed by integrating a power circuit board, on which are mounted a plurality of semiconductor power switching devices (power devices, such as IGBTs) (not shown) and a power-system circuit, and a control board (printed board), which is provided with control and communication circuits having devices operating at low voltage, such as a CPU. The external shape of this inverter module 24 is shown in FIGS. 3A to 3D. The inverter module 24 is constructed of a module main body 27 that is a substantially cuboid box shape with a bottom surface, and the devices, the electronic components, the circuit, and so on are mounted in the interior thereof. An input-side P-N terminal 28 provided on the inverter module 24 is connected to the high-voltage power supply line connected to the P-N terminals 16 and 17 via the high-voltage bus-bar 25, and output-side U-V-W terminals 29 are connected to the glass-insulated terminal 26.

Attachment legs 30A to 30D for securely tightening the inverter module 24 with screws 31 inside the inverter accommodating section 11 are provided at both ends of two opposing side surfaces of the module main body 27. The attachment legs 30A and 30B of the four attachment legs 30A to 30D provided at both ends of the side surface provided with the U-V-W terminals 29 project outward and, as shown in FIG. 2, are securely tightened by the screws 31 inside the inverter accommodating section 11 by utilizing dead space formed at both ends of the glass-insulated terminal 26. On the bottom surface of the module main body 27, an aluminum alloy thin plate 32 that contacts the bottom surface of the inverter accommodating section 11 and transmits the heat of the semiconductor power switching devices provided on the inverter module 24 to a refrigerant flowing through the wall thereof into the motor housing 3 is provided.

According to this embodiment with the above-described configuration, the following advantages are achieved.

DC power supplied from a high-voltage power supply mounted in the vehicle to the P-N terminals 16 and 17 of the inverter device 20 of the electric compressor 1 via the power-supply cables 14 and 15 is regulated by the high-voltage components, such as the head capacitor 21, the inductor coil 22, and the common mode coil 23 and is input to the inverter module 24 via the input-side P-N terminal 28. This DC power is converted into three-phase AC power having a control command frequency instructed by a higher order control device (not shown) by the switching operation of the plurality of semiconductor power switching devices (power devices, such as IGBTs) mounted in the inverter module 24 and is then supplied from the U-V-W terminals 29 to the electric motor 9 inside the motor housing 3 via the glass-insulated terminal 26.

In this way, the electric motor 9 is rotationally driven at the control command frequency, and the compression mechanism is operated. By operating the compression mechanism, low-temperature, low-pressure refrigerant gas is taken into the motor housing 3 through the refrigerant suction port 6. This refrigerant flows around the electric motor 9 to the compressor housing 4 in the motor axis L direction, is taken in to the compression mechanism, compressed to a high-temperature, high-pressure state, and then discharged into the compressor housing 4. The high-temperature, high-pressure refrigerant is discharged outside the electric compressor 1 from the discharge port 7. During this period, the low-temperature, low-pressure refrigerant taken in from the refrigerant suction port 6 to the motor housing 3 and flowing in the motor axis L direction cools the heat-radiating components of the inverter device 20, such as the high-voltage components and the semiconductor power switching devices installed in the inverter accommodating section 11, via the walls of the motor housing 3 and the thin plate 32.

However, in this embodiment, as shown in FIG. 2, since dead space is formed at both ends of the glass-insulated terminal 26 when accommodating and installing the inverter device 20 inside the inverter accommodating section 11, the inverter module 24 is installed utilizing this dead space. In other words, with the outwardly protruding attachment legs 30A and 30B positioned in the dead space and installing the inverter module 24 so that it sandwiches the glass-insulated terminal 26 from both ends, the inverter module 24 and the glass-insulated terminal 26 can be installed close to each other. In this way, the component layout density inside the inverter accommodating section 11 can be increased.

By making the attachment legs 30A and 30B protrude outward from the module main body 27, the module main body 27 can be made more compact by the same amount, and the positioning of the devices, electronic components, and circuits can be facilitated. As a result, the size of the inverter module 24 can be reduced.

By a synergistic effect of the increase in the component layout density and the decrease in size of the inverter module 24, the size of the inverter device 20 and the inverter accommodating section 11 can be reduced even more. Consequently, the size and weight of the inverter-integrated electric compressor 1 can be reduced, and the mounting convenience in the vehicle can be improved.

This embodiment is configured such that the high-voltage components, such as the head capacitor 21, the inductor coil 22, and the common mode coil 23, are positioned to surround the other side surface of the inverter module 24 and such that electrical wiring for the high-voltage power supply line is provided via the high-voltage bus-bar 25. However, the positions of these high-voltage components are not particularly limited. The high-voltage bus-bar 25 is disposed in the space above the inverter module 24, and an aluminum alloy shield plate 33 is disposed therebetween so as to block electromagnetic noise transmission from the high-voltage bus-bar 25 to the low-voltage circuit area in the inverter module 24.

Second Embodiment

Next, a second embodiment of the present invention will be described with reference to FIG. 4.

This embodiment differs from the above-described first embodiment in the configuration of the attachment legs provided on the inverter module 24. Since other aspects are the same as those in the first embodiment, descriptions thereof will be omitted.

Figure 4:
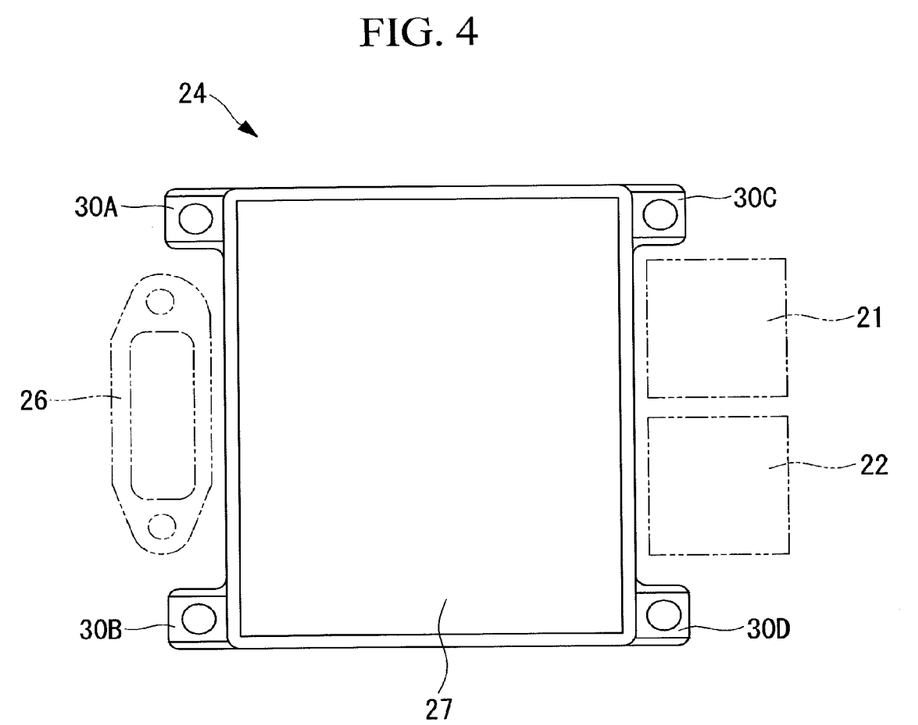
FIG. 4 is a plan view of an inverter module of an inverter-integrated electric compressor according to a second embodiment of the present invention.

As shown in FIG. 4, in this embodiment, among the four attachment legs 30A to 30D provided on the inverter module 24, not only the attachment legs 30A and 30B but also the other two attachment legs 30C and 30D protrude outward from the module main body 27.

Then, the inverter module 24 is disposed such that the attachment legs 30A and 30B are disposed in the dead space so as to sandwich the glass-insulated terminal 26 from both ends, and the high-voltage components, such as the head capacitor 21, the inductor coil 22, and the common mode coil 23, are disposed (the head capacitor 21 and the inductor coil 22 are disposed in this embodiment) between the attachment legs 30C and 30D provided on the opposite side surface. The electrical components provided between the attachment legs 30C and 30D are not limited to the head capacitor 21 and the inductor coil 22, and other electrical components may of course be provided.

As described above, since all four attachment legs 30A to 30D provided on the inverter module 24 protrude outward from the module main body 27 and the electrical components, such as the glass-insulated terminal 26, the head capacitor 21, and the inductor coil 22, are disposed between the attachment legs 30A and 30B and between the attachment legs 30C and 30D, the component layout density inside the inverter accommodating section 11 can be increased even more. Since the attachment legs 30A to 30D protrude outward from the module main body 27, the inner boards can be simple rectangular shapes. Therefore, the positions of the devices, electronic components, and circuits provided on the boards can be simplified. As a result, the size of the inverter module 24 can be reduced even more. In this way, the size of the inverter device 20 and the inverter accommodating section 11 can be reduced even more.

Third Embodiment

Next, a third embodiment of the present invention will be described with reference to FIG. 5.

This embodiment differs from the above-described first embodiment in the positional structure of the inverter accommodating section 11 and the inverter device 20 with respect to the motor housing 3. Since other aspects are the same as those in the first embodiment, descriptions thereof will be omitted.

Figure 5A:
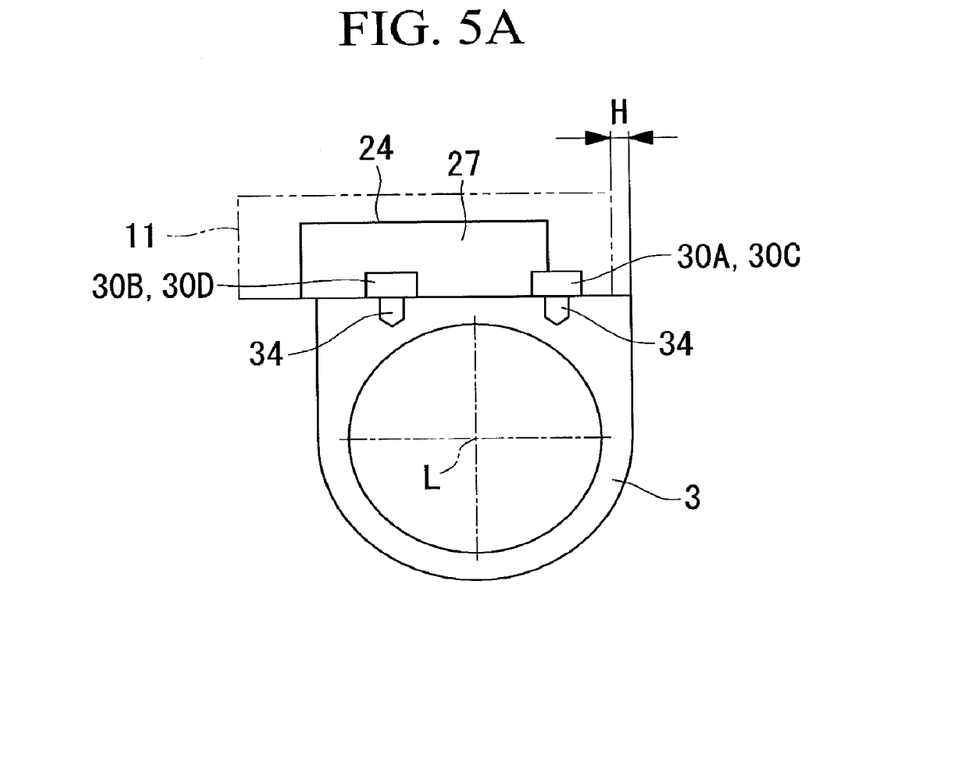
FIG. 5A is a schematic longitudinal sectional view of an inverter module of an inverter-integrated electric compressor according to a third embodiment of the present invention.
Figure 5B:
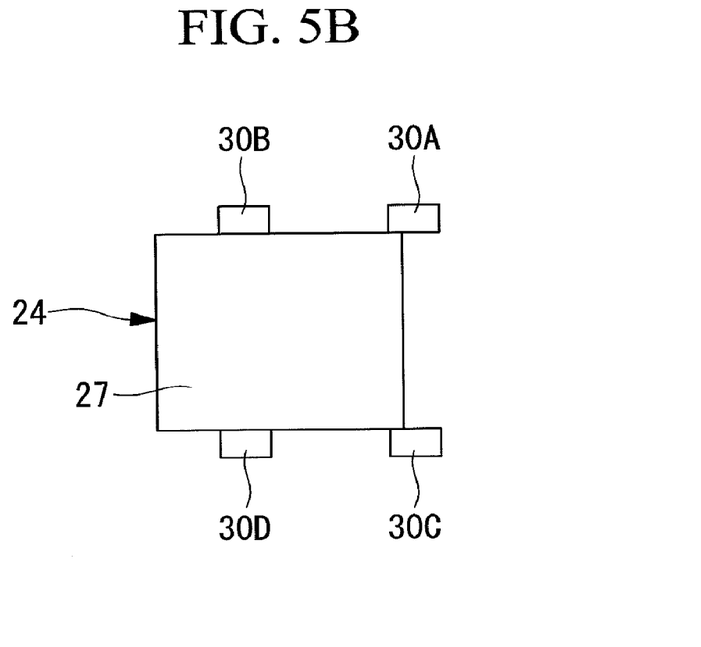
FIG. 5B is a schematic plan view of the inverter module of the inverter-integrated electric compressor according to the third embodiment of the present invention.

In this embodiment, as shown in FIG. 5, to protect the high-voltage system of the inverter device 20 when the vehicle is in a crash, the inverter accommodating section 11 is positioned with an offset of dimension H on the rear side of the vehicle in a direction orthogonal to the motor axis L direction with respect to the motor housing 3 having a pressure-resistant structure positioned forward in the vehicle traveling direction. According to this structure, the attachment legs 30A to 30D provided on the inverter module 24 are positioned with an offset with respect to the module main body 27, as shown in FIG. 5B.

According to this embodiment, even when the inverter accommodating section 11 and the inverter device 20 are positioned with an offset in a direction orthogonal to the motor axis L direction with respect to the motor housing 3 and the high-voltage system is protected against a crash, the attachment legs 30A to 30D for securing the inverter module 24 to the motor housing 3 with screws can be secured with screws on the motor housing 3 side at substantially equal distances on either side of the motor axis L.

Therefore, as shown in FIG. 5A, screw holes 34 for screwing may be vertically formed in thick-walled parts of the motor housing 3. Consequently, the screw holes 34 can prevent a reduction in the pressure resistance of the motor housing 3, and the screw holes 34 can be formed at positions away from the refrigerant circulation path (positions where the axes of the screws do not penetrate the motor housing 3). In this way, refrigerant gas leakage due to exposure of porosity inside the motor housing 3 to the screw holes 34 can be reduced, and the gas-tightness of the motor housing 3 can be ensured.

The present invention is not limited to the embodiments described above, and various modifications may be made so long as they do not depart from the spirit of the invention. For example, the compressing mechanism provided inside the compressor housing 4 is not particularly limited, and any type of compressing mechanism may be used, e.g., a rotary type, a scroll type, or a swash plate type. Moreover, the inverter accommodating section 11 does not necessarily have to be integrated with the motor housing 3, and separate parts may be assembled into a single unit.

Furthermore, the installation position of the glass-insulated terminal 26 does not necessarily have to be at the front end of the motor housing 3 (close to the compressor housing 4) as in the above-described embodiments. Instead, the installation position may be at the end edge or the side of the motor housing 3. In such a case, the installation direction and positions of the inverter module 24 and other electrical components are appropriately changed in accordance with the change.

The invention claimed is:
1. An inverter-integrated electric compressor in which an inverter accommodating section is provided on a periphery of a housing accommodating an electric motor and a compressing mechanism, and an inverter device that converts DC power supplied from a high-voltage power supply into three-phase AC power and supplies the three-phase AC power to the electric motor in the housing via a glass-insulated terminal is accommodated inside thereof, wherein the inverter device includes an inverter module constructed by integrally modularizing a power circuit board on which a semiconductor switching device and so on are mounted and a control board on which control and communication circuits and so on operating at low voltage are mounted, wherein attachment legs protruding outward from a module main body are provided at both ends of at least one side surface of the inverter module, and wherein the inverter module is accommodated in the inverter accommodating section by positioning the attachment legs in spaces at both ends of the glass-insulated terminal.

2. The inverter-integrated electric compressor according to claim 1, wherein the inverter module is substantially cuboid, and the attachment legs provided at both ends of two opposing side surfaces thereof all protrude outward from the module main body.

3. The inverter-integrated electric compressor according to claim 2, wherein other electrical component constituting the inverter device are positioned in a space between the attachment legs provided on the other side surfaces of the two opposing side surfaces of the inverter module.

4. The inverter-integrated electric compressor according to claim 2, wherein the attachment legs provided on each side surfaces of the two opposing side surfaces of the inverter module are positioned with an offset in a direction orthogonal to a motor axis direction of the electric motor with respect to the module main body.

5. The inverter-integrated electric compressor according to claim 3, wherein the attachment legs provided on each side surfaces of the two opposing side surfaces of the inverter module are positioned with an offset in a direction orthogonal to a motor axis direction of the electric motor with respect to the module main body.

* * * * *